(12) United States Patent
Kwak et al.

(10) Patent No.: US 10,256,813 B2
(45) Date of Patent: Apr. 9, 2019

(54) FAST TRANSIENT HIGH-SIDE GATE DRIVING CIRCUIT

(71) Applicant: QUALCOMM Incorporated, San Diego, CA (US)

(72) Inventors: Taewoo Kwak, San Diego, CA (US); Joseph Rutkowski, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 31 days.

(21) Appl. No.: 15/497,337

(22) Filed: Apr. 26, 2017

(65) Prior Publication Data

US 2018/0316345 A1    Nov. 1, 2018

(51) Int. Cl.
| | |
|---|---|
| H03K 3/00 | (2006.01) |
| H03K 17/687 | (2006.01) |
| H02M 3/158 | (2006.01) |
| H02M 1/08 | (2006.01) |

(52) U.S. Cl.
CPC ........ *H03K 17/6872* (2013.01); *H02M 3/158* (2013.01); *H02M 1/08* (2013.01)

(58) Field of Classification Search
None
See application file for complete search history.

(56) References Cited

U.S. PATENT DOCUMENTS

| | | | | |
|---|---|---|---|---|
| 7,391,169 B2* | 6/2008 | Huang | ................. | H05B 41/282 |
| | | | | 315/291 |
| 8,519,746 B2* | 8/2013 | Wang | ...................... | H03L 7/099 |
| | | | | 327/103 |
| 9,354,649 B2* | 5/2016 | Ho | ........................... | G05F 1/575 |
| 9,395,730 B2 | 7/2016 | Singh et al. | | |
| 9,949,023 B2* | 4/2018 | Astgimath | ............... | H04R 3/00 |
| 2010/0109779 A1* | 5/2010 | Pham | ...................... | H03F 1/086 |
| | | | | 330/296 |
| 2013/0076403 A1* | 3/2013 | Wang | ...................... | H03L 7/099 |
| | | | | 327/103 |
| 2015/0318829 A1 | 11/2015 | Astgimath | | |
| 2016/0173066 A1* | 6/2016 | Yang | .................. | H03K 19/0013 |
| | | | | 327/109 |
| 2016/0365859 A1* | 12/2016 | Song | .............. | H03K 19/018514 |

FOREIGN PATENT DOCUMENTS

EP          3104523 A1 * 12/2016   ..... H03K 19/018514

OTHER PUBLICATIONS

Jeong D., "Ultra-Low Power Direct-Conversion 16 QAM Transmitter Based on Doherty Power Amplifier", IEEE Microwave and Wireless Components Letters, vol. 26, No. 7, Jul. 2016, pp. 528-530.
Lu Y., et al., "A 312 Ps Response-Time LDO with Enhanced Super Source Follower in 28 nm CMOS", Electronics Letters, vol. 52, No. 16, Aug. 4, 2016, pp. 1368-1370.

* cited by examiner

*Primary Examiner* — Lincoln D Donovan
*Assistant Examiner* — Khareem E Almo
(74) *Attorney, Agent, or Firm* — Hunter Clark PLLC

(57) ABSTRACT

Techniques for improving the transient response in a switching converter are provided. An example of a gate driving circuit for driving a high-side switch in a switching converter according to the disclosure includes a first switch operably coupled to a source lead and a gate lead of the high-side switch, a first super source follower circuit operably coupled to the gate lead of the high-side switch, and a mid-voltage power supply operably coupled to the first super source follower circuit.

26 Claims, 6 Drawing Sheets

FAST TRANSIENT HIGH-SIDE GATE DRIVING CIRCUIT

FIELD

The disclosure relates to techniques for high-side gate driving in switching converters, and specifically to reducing the burden of high current driving in a mid-voltage rail design.

BACKGROUND

Switching converters may be used for DC-to-DC conversion in many applications and may provide performance improvements as compared to linear power regulations circuits. In general, a switching converter may include one or more power switches, inductors and diodes to transfer a DC input to a DC output. These components may be configured, for example, to perform a step-down function (e.g., a buck converter), a step-up function (e.g., boost converter), or an inverting function (e.g., inverting buck-boost, flyback). Switching converters may be used in other types of power regulation circuits as well. The power switches in a switching converter are typically semiconductor devices and may be intolerant to voltage and current signals which exceed the device design parameters. For example, exceeding the gate-to-source voltage rating in a power switch is likely to destroy the device. In an effort to avoid this limitation, switching converter designs often employ a floating voltage rail to reduce the voltage across the gate-to-source junction. The presence of such a floating voltage rail, however, may significantly increase the complexity and area required for a switching converter circuit design. Further, the impedance of the floating rail may impact the time constant of the switching circuit and decrease the overall performance of the converter.

SUMMARY

An example of a gate driving circuit for driving a high-side switch in a switching converter according to the disclosure includes a first switch operably coupled to a source lead and a gate lead of the high-side switch, a first super source follower circuit operably coupled to the gate lead of the high-side switch, and a mid-voltage power supply operably coupled to the first super source follower circuit.

Implementations of such a gate driving circuit may include one or more of the following features. The high-side switch may be a p-channel semiconductor switch. The high-side switch may be a p-type field-effect transistor (PFET). The first super source follower circuit may include at least a p-channel semiconductor switch, a n-channel semiconductor switch and a resistor. The p-channel semiconductor switch may be a p-type field-effect transistor (PFET) and the n-channel semiconductor switch may be a n-type field-effect transistor (NFET). A source of the PFET may be operably coupled to the gate lead of the high-side switch, and a drain lead of the PFET may be operably coupled to a gate lead of the NFET and the resistor. The mid-voltage power supply may be operably coupled to a gate of the PFET. The switching converter may be configured to output a desired output voltage and a voltage output of the mid-voltage power supply is greater than a difference between the desired output voltage and a gate-to-source voltage rating for the high-side switch. At least a second super source follower circuit may be operably coupled between the first super source follower circuit and the mid-voltage power supply. A third super source follower circuit may be operably coupled between the second super source follower circuit and the mid-voltage power supply.

An example of a method of constructing a switched-mode power converter according to the disclosure includes configuring the switched-mode power converter including at least a high-side switch and a low-side switch based on a desired output voltage, operably coupling a gate driving circuit to the high-side switch, such that the gate driving circuit includes a first switch and a first super source follower circuit, and operably coupling a mid-voltage power supply to the first super source follower circuit, such that a mid-voltage power supply voltage is based on the desired output voltage and a gate-to-source voltage rating of the high-side switch.

Implementations of such a method may include one or more of the following features. The desired output voltage may be greater than the gate-to-source voltage rating for the high-side switch. The first super source follower circuit may include at least a p-type field-effect transistor (PFET), a n-type field-effect transistor (NFET), and a resistor, and operably coupling the gate driving circuit to the high-side switch may include connecting a source lead of the PFET and a drain lead of the NFET to a gate lead on the high-side switch. Operably coupling the mid-voltage power supply to the first super source follower circuit may include operably coupling the mid-voltage power supply to a gate lead on the PFET. The mid-voltage power supply voltage may be greater than a difference between the desired output voltage and the gate-to-source voltage rating of the high-side switch. A second super source follower circuit may be operably coupled between the first super source follower circuit and the mid-voltage power supply.

An example of a gate driving circuit according to the disclosure includes a power stage switch including a gate-source voltage rating and a drain-source voltage rating, such that the gate-source voltage rating is lower than the drain-source voltage rating, a first super source follower circuit operably coupled to the gate lead of the power stage switch, and a mid-voltage power supply operably coupled to the first super source follower circuit.

Implementations of such a gate driving circuit may include one or more of the following features. The power stage switch may be an n-channel semiconductor switch. The power stage switch may be a p-type field-effect transistor (PFET). The first super source follower circuit may include at least a p-channel semiconductor switch, a n-channel semiconductor switch and a resistor. The p-channel semiconductor switch may be a p-type field-effect transistor (PFET) and the re-channel semiconductor switch may be a n-type field-effect transistor (NFET). The mid-voltage power supply may be operably coupled to a gate of the PFET. At least a second super source follower circuit may be operably coupled between the first super source follower circuit and the mid-voltage power supply. At least a third super source follower circuit may be operably coupled between the second super source follower circuit and the mid-voltage power supply.

An example of an apparatus according to the disclosure includes a power converter means including a power stage switch, a gate driving means operably coupled to the power stage switch, such that the gate driving means includes a first super source follower circuit, and a mid-voltage power means operably coupled to the first super source follower circuit.

Implementations of such an apparatus may include one or more of the following features. The power stage switch may include a gate-source voltage rating and a drain-source voltage rating, and the gate-source voltage rating is less than the drain-source voltage rating. An output voltage from the power converter means may be greater than the gate-source voltage rating. The mid-voltage power means may provide a mid-voltage value that is greater than a difference between the output voltage and the gate-source voltage rating. The first super source follower circuit may include at least a p-type field-effect transistor (PFET), a n-type field-effect transistor (NFET), and a resistor. A second super source follower circuit may be operably coupled between the first super source follower circuit and the mid-voltage power means.

Items and/or techniques described herein may provide one or more of the following capabilities, as well as other capabilities not mentioned. A switched-mode power converter may include a high-side switch and a low-side switch. The high-side and low-side switches may be semiconductor devices. The voltage output of the power converter may exceed the gate-to-source voltage limit of the high-side switch. A mid-voltage power supply may be used to clamp the gate voltage on the high-side switch to ensure the gate-to-source voltage limit is not exceeded. A super source follower circuit may be operably coupled to the high-side switch and the mid-voltage power supply. The super source follower circuit may reduce the current flow through the mid-voltage power supply. The reduction in current flowing from the gate of the high-side switch may reduce the complexity of the mid-voltage power supply design. Larger internal or external capacitors in the mid-voltage power supply may be eliminated. The reduction in capacitance in the gate driving circuit improves the response of the high-side switch. The transient response of the power converter may be improved. Additional super source follower circuits may be added to a gate driver circuit to further reduce the current flowing through the mid-voltage power supply. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

DETAILED DESCRIPTION

Techniques are discussed herein for improving the transient response in a switching converter. A switching device in the converter may be limited to relatively low gate-to-source voltage level. In some designs, a mid-voltage power supply (e.g., rail) may be included in the gate driver circuit to overcome the gate-to-source voltage limitation. The mid-voltage power supply, however, may increase the complexity and required area of the gate driver circuit, as well as degrade the transient performance of the converter (e.g., due to the impedance associated with the mid-voltage power supply). As described herein, a super source follower (SSF) circuit may be employed to reduce the complexities associated with the mid-voltage power supply. For example, a high-side gate driving circuit in a switching regulator may include one or more super source follower circuits to reduce the design complexity for the mid-voltage power supply in the gate driver design. These examples, however, are not exhaustive.

Figure 1:
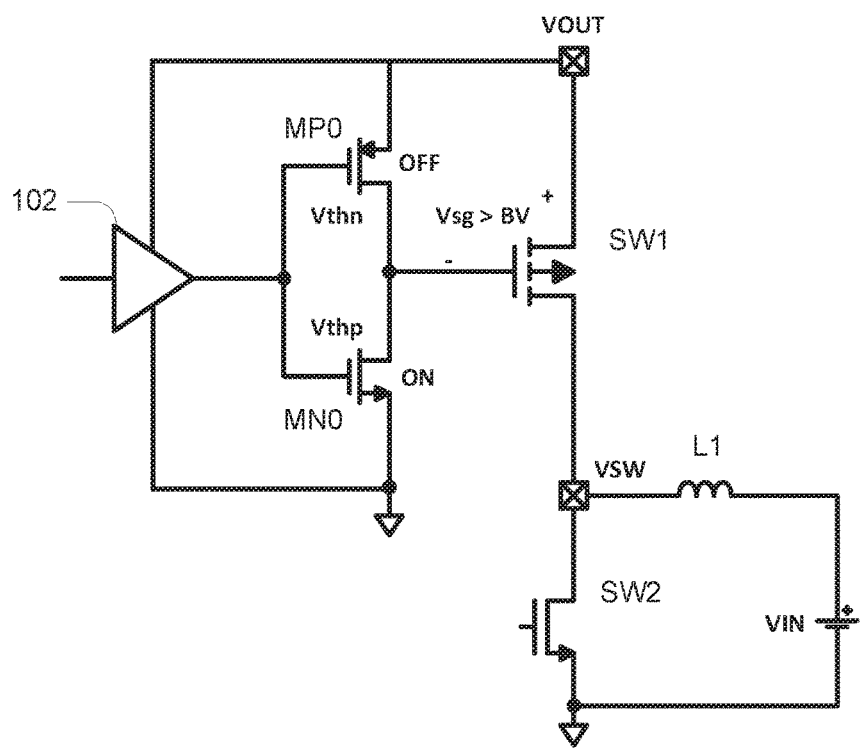
FIG. 1 is a schematic diagram of an example converter with an inverter type high-side switch driver.

Referring to FIG. 1, a schematic diagram of an example converter 100 with an inverter type high-side switch driver is shown. The converter 100 is an example power converter means such as a boost converter with a high-side switch SW1, a low-side switch SW2, and an inductor L1. The low-side switch SW2 is coupled to a driving circuit (not shown in FIG. 1). The gate of the high-side switch SW1 is operably coupled to a switching network including a P-type Field Effect Transistor (PFET) MP0 and a N-type FET (NFET) MN0. The switching network MP0, MN0 is classified as an inverter type gate driver. The drains of MP0 and MN0 are coupled together and are used to drive the high-side switch SW1. The switching network is operably coupled to a control circuit such as the Integrated Circuit (IC) 102. The IC 102 is configured to control the high-side switch SW1 by providing a voltage signal to the gates of MP0 and MN0. The boost (i.e., step-up) configuration of the converter 100 is an example only and not a limitation. The fast transient high-side gate driving circuit described herein may be used with other switching converters (e.g., buck, buck-boost, inverters, etc.). The boost converter embodiment is provided as an example to facilitate the explanation of the objective technical problem and does not limit the present disclosure.

The converter 100 in FIG. 1 is provided as an example of a circuit that may exceed the gate-to-source voltage rating of the high-side switch SW1. For example, the converter 100 is implemented as part of a DC-to-DC step-up circuit to increase the value of an input voltage (Vin). In a typical boost converter topology the high-side switch SW1 is a PFET device and the low-side switch SW2 is a NFET device. Generally, the step-up function of a boost converter enables an output voltage (Vout) that is higher than the input voltage (Vin). As a result, as depicted in FIG. 1, the high-side switch SW1 is switching between 0V and Vout. In a consumer sized device, for example, SW1 may be a 10V device but the gate-to-source voltage limit may be only 6V. In this example, the inverter type gate driving network (MP0, MN0) as shown in FIG. 1 may cause the gate-to-source voltage across SW1 to be greater than the gate-to-source breakdown voltage (BV) of SW1. Exceeding the designed gate-to-source voltage of SW1 is likely to cause permanent damage the device. As will be described, prior art solutions attempt to avoid this issue by clamping the gate of the high-side switch SW1 to a mid-voltage rail to ensure SW1 is operating within a safe range. Such mid-voltage rail solutions, however, may increase the complexity and cost of the circuit. Further, the impedance of the mid-voltage rail may negatively impact the time constant of the circuit and impact the switching time for the high-side switch SW1.

Figure 2A:
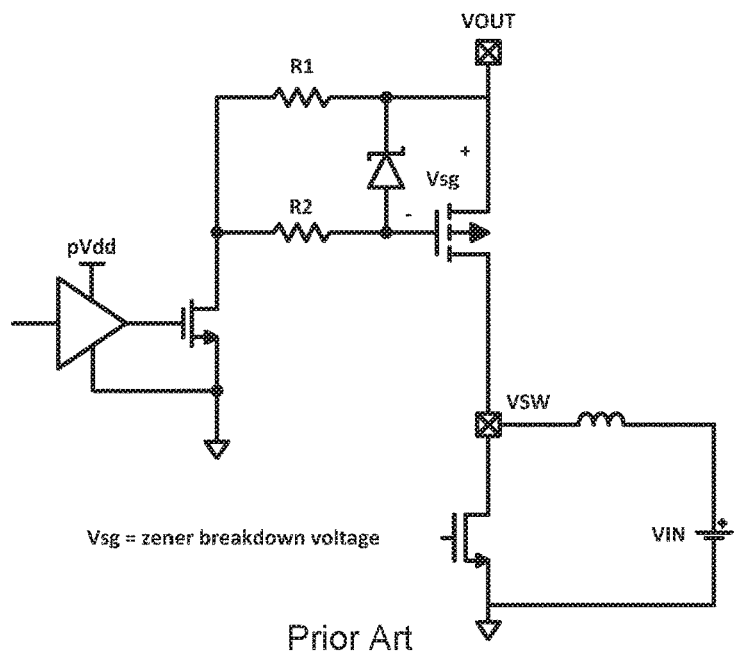
FIG. 2A is a schematic diagram of an example converter with a zener diode.
Figure 2B:
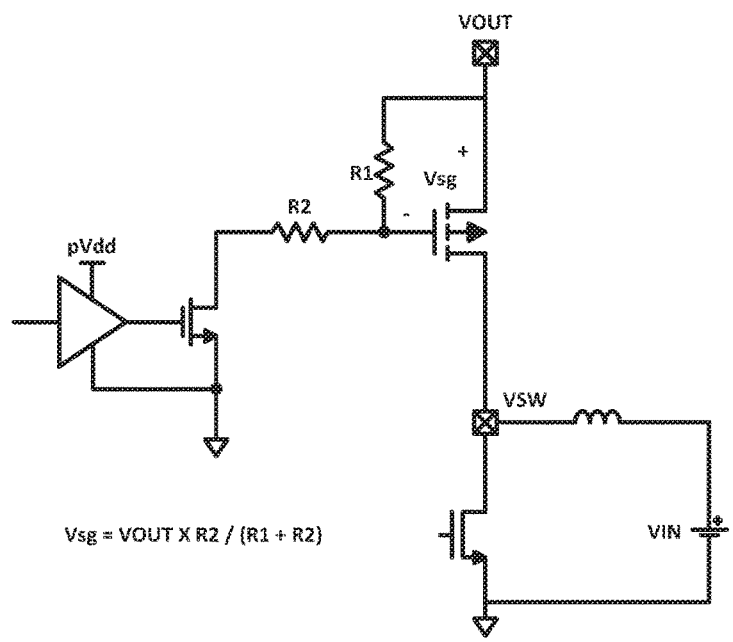
FIG. 2B is a schematic diagram of an example converter with resistive divider network.
Figure 2C:
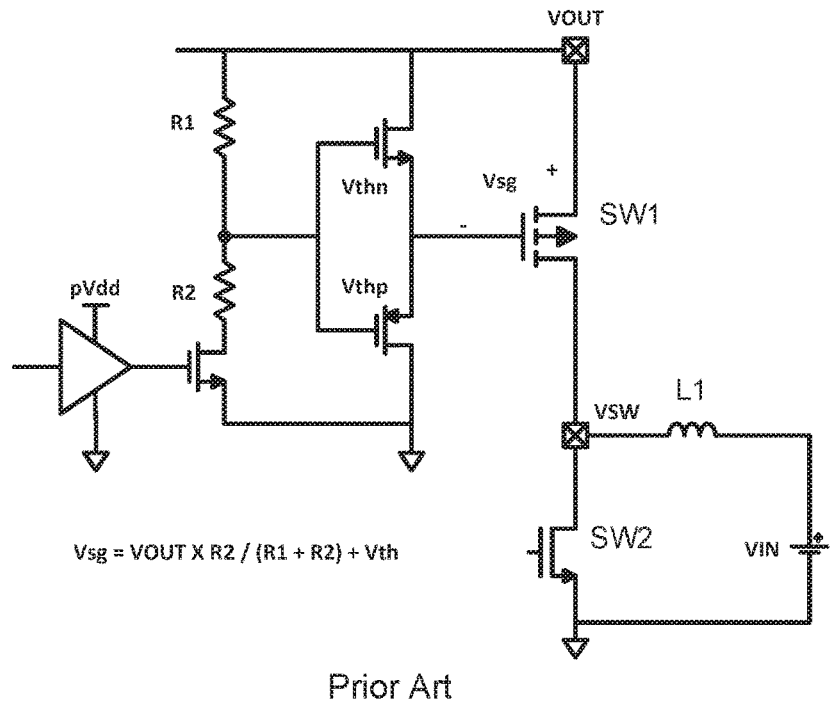
FIG. 2C is a schematic diagram of an example converter with a class AB or B buffer.
Figure 2D:
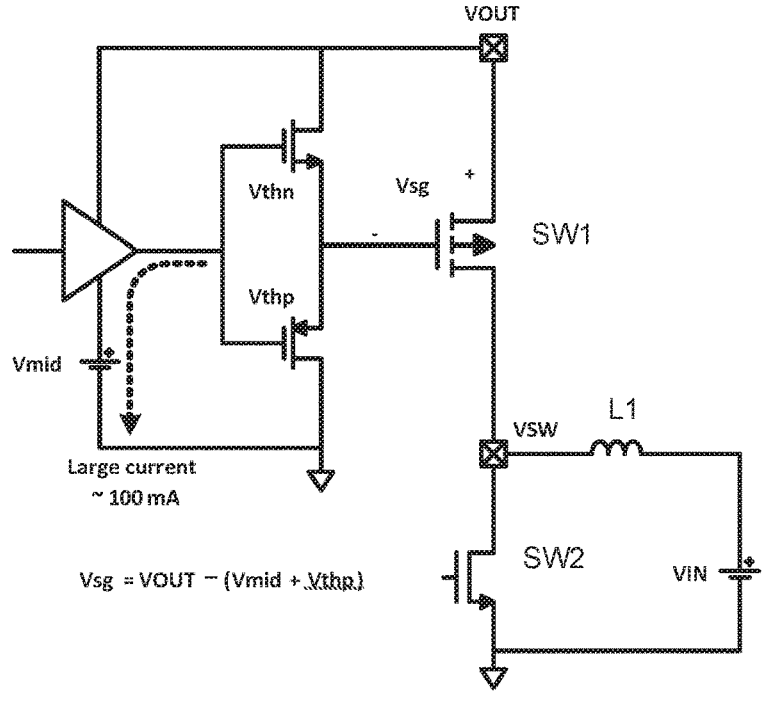
FIG. 2D is a schematic diagram of an example converter with a mid-voltage rail.

Referring to FIGS. 2A, 2B, 2C and 2D, examples of prior art circuits to maintain required gate-to-source voltage levels are shown. FIG. 2A provides a converter with a Zener diode. A Shockley diode may be disposed between the output voltage (Vout) and the gate as depicted in FIG. 2A. The diode is used to limit the gate-source voltage (e.g., Vsg=Zener breakdown voltage). The circuit in FIG. 2A may not be practical in high-power or stored power solutions because the static loss through the Zener diode may decrease the power efficiency of the circuit. FIG. 2B provides a converter with a resistive divider network including a first resistor R1 and a second resistor R2. When the high-side switch is on, the output voltage Vout is divided by resistor network and the gate-to-source voltage may be clamped based on the ratio of R1:R2 (e.g., (Vout*R2)/(R1+R2)). The parasitic capacitance associated with R1 and R2, however, may impact the R-C time constant of the switch. As a result, the resistive divider network of FIG. 2B may not be suitable for high-speed applications. FIG. 2C provides a converter with a class AB or B buffer. The buffer may include, for example, NMOS and PMOS switches and a resistor network including a first resistor R1 and a second resistor R2. The NMOS and PMOS switches may have an activation threshold voltage Vth. The Vsg value of the high-side switch SW1 may be clamped based on the Vth and resistor values (e.g., Vsg=((Vout*R2)/(R1+R2))+Vth)). The use of the resistors R1, R2 may impact the R-C time constant of the gate driver and thus impact the performance of the circuit in high-speed or fast transient applications. FIG. 2D provides an example converter with a mid-voltage rail Vmid. The voltage rail is generally a low impedance power supply configured to provide a voltage between ground and Vout. The mid-voltage rail decreases the gate-to-source voltage on SW1 based on the value of Vmid and the PMOS threshold voltage Vthp (e.g., Vsg=Vout−(Vmid+Vthp)). The power supply typically requires the area to create a larger capacitor and should be low impedance to allow for the quick discharge of the current from the gate of SW1. The requirement for a low impedance power supply adds complexity and cost to the circuit design.

Figure 3:
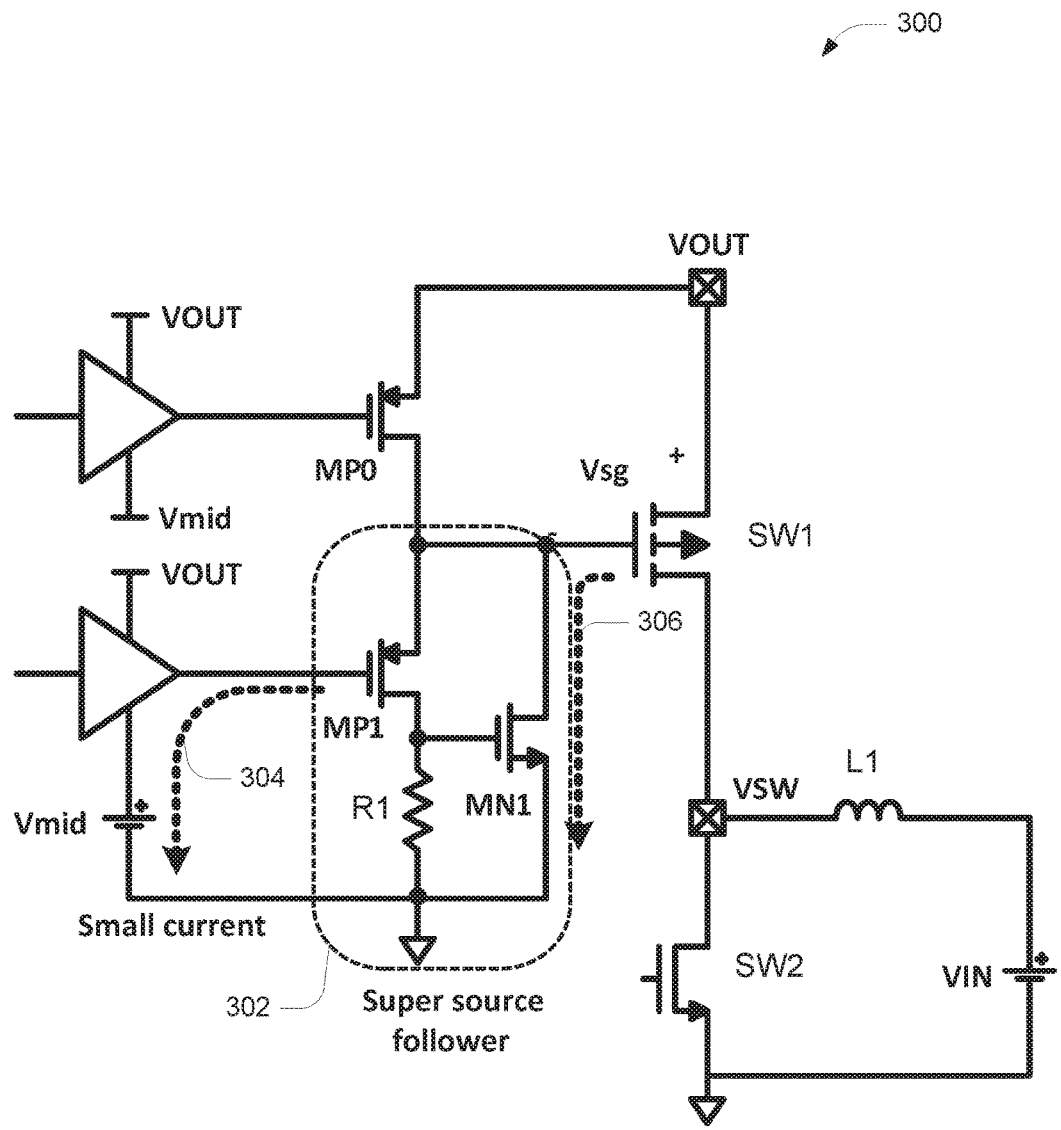
FIG. 3 is a schematic diagram of an example converter with a super source follower.

Referring to FIG. 3, a schematic diagram of an example converter 300 with a super source follower is shown. The switches depicted may be metal oxide semiconductor field-effect transistors (e.g., p-channel and n-channel MOSFETs), bipolar junction transistors (BJTs), junction gate field-effect transistors (JFETs), or other switches based on application specific voltages and currents. In an example, the converter 300 is configured as a boost converter with an inductor L1, a high-side PFET switch SW1 and a low-side NFET switch SW2. A gate driving circuit (not shown in FIG. 3) is coupled to the gate of the low-side switch SW2. The gate of the high-side switch SW1 is operably coupled to a gate driving circuit including a PMOS high-side gate switch MP0 and a super source follower circuit 302 including a PFET MP1, a NFET MN1 and a resistor R1. The gate driver in the converter 300 is an example gate driving means and is a modification of the inverter type driver depicted in FIG. 1. Specifically, in the converter 300, the gate lead of the high-side switch SW1 is connected to the drain lead of the PMOS MP0, the source lead of the PFET MP1, and the drain lead of the NFET MN1. The gate of the PFET MP1 is clamped to the output of a mid-voltage power supply Vmid. The mid-voltage power supply Vmid is an example of a mid-voltage power means with a mid-voltage value of Vmid. The configurations of the high-side switch SW1 and the low-side switch SW2 are exemplary only and not limitations. Other switching configurations and technologies may be used. The super source follower driving circuit design provided herein may be used when the gate-source voltage rating of a switch is less than the drain-source voltage rating of the switch (e.g., when the switch would need a gate-to-source clamping circuit including a floating voltage rail).

In operation, the high-side gate switch MP0 operates similar to the inverter type gate configuration in FIG. 1 in that when MP0 is turned on, the high-side switch SW1 will quickly turn off. The issue the converter 300 addresses is to limit the low side voltage when the low-side gate driver switch MN1 is turned on. The super source follower circuit 302 limits the voltage in the gate driver circuit. When the PFET MP1 is turned on, a current flows through the resistor R1. When the voltage across R1 is high enough to turn on the NFET MN1, the voltage gate of SW1 tries to go to ground. As the voltage at the gate of SW1 decreases below Vmid, the gate-to-source voltage across the PFET MP1 drops below the threshold voltage which will turn off the NFET MN1. The super source follower circuit 302 is therefore clamped between Vmid. This effectively clamps the gate of the high-side switch SW1 to between Vout and Vmid. An advantage of the super source follower circuit 302 is the first current path 306. The first current path 306 is a graphic representation that the majority of the current flowing from the gate of the high-side switch SW1 flows through the NFET MN1. A smaller amount of current (e.g., approximately the square root for the current in the first current path 306) flows through a second current path 304. Since the current in the second current path 304 is less, the requirements of the PFET switch MP1 may be obtained with a smaller device with a corresponding smaller parasitic capacitance. The smaller current also reduces the impact of the impedance due to the Vmid power source. The reduction in current reduces the complexities and required area. Further, since the parasitic capacitance associated with the components in the super source follower circuit 302 may be small, the converter 300 will have a faster transient response based on the improvement in the time constant. While FIG. 3 is described in the context of a boost converter, the present disclosure is not so limited. The high-side gate driving circuit may be used in other switching regulators or circuits with a high conversion ratio such that the input voltage is low and the output voltage is high (e.g., exceeds the maximum gate-to-source voltage for the transistors). The implementation of the super source follower circuit 302 on a high-side switch improves the operation of the switch (e.g., switching speed) while requiring less power and less area.

Figure 4:
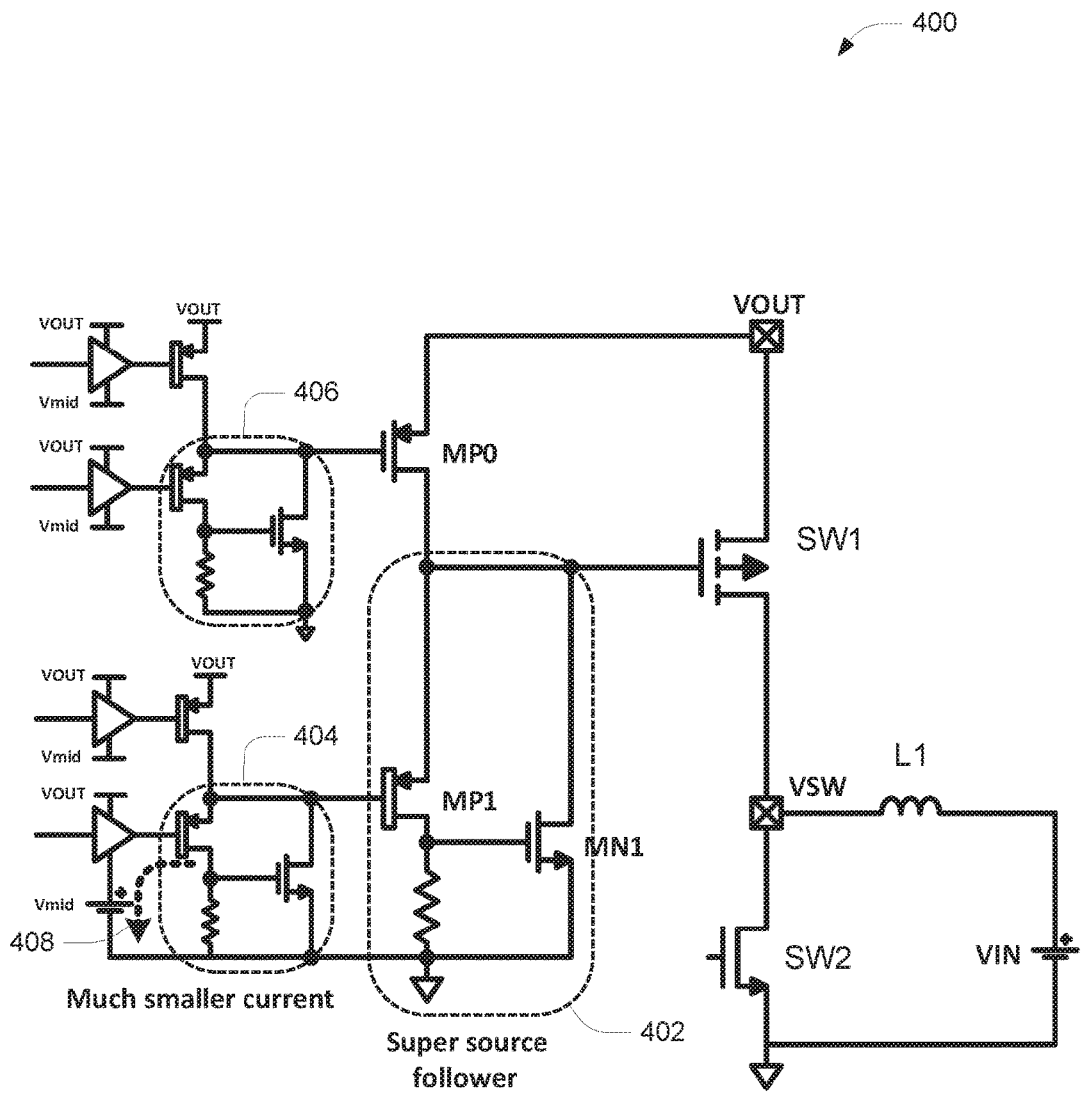
FIG. 4 is a schematic diagram of an example converter with multiple stages.

Referring to FIG. 4, a schematic diagram of an example converter 400 with multiple stages is shown. The converter 400 may include a high-side switch SW1, a low-side switch SW2 and an inductor L1 as previously described. The gate of the high-side switch SW1 is operably coupled to a gate driving circuit including a PMOS high-side gate switch MP0 and a primary super source follower circuit 402 including a PFET MP1, a NFET MN1 and a resistor R1. The converter 400 illustrates the benefits of extending the super source circuit design discussed in FIG. 3 further into the gate driving circuit. Specifically, the converter 400 includes a first secondary super source follower circuit 404 and a second secondary super source follower circuit 406. The secondary super source follower circuits 404, 406 each include a p-channel device (e.g., PFET), and n-channel device (e.g., NFET) and a resistor. The secondary super source follower circuits 404, 406 are essentially cascading gate driving circuits that are operably coupled to a primary gate driving circuit such that one super source follower circuit drives another super source follower circuit. The converter 400 illustrates two levels of cascading driving circuits (e.g., primary, secondary), but the present disclosure is not so limited. Additional cascading levels (e.g., tertiary, quaternary, etc.) may be added to provide the benefits described herein.

Extending the super source follower design to multiple stages provides a benefit in reducing the complexity of the mid-voltage power supply design Vmid. A prior art mid-voltage power supply is designed to have low-impedance because it may be configured to absorb a certain level of gate charge from the power stage switch (e.g., SW1). The amount of gate charge the mid-voltage power supply must handle can be significantly reduced by adding one or more the super source follower circuits. For example, referring to FIG. 4, the size (e.g., physical size, current limits) of MP1 may be approximately the square root of the power stage device SW1 (e.g., +/−20%). The requirements on the mid-voltage power supply with a super source follower circuit are reduced in terms of the gate charge requirements. For example, referring to FIG. 2D, for a 10V Vout and a 5V-6V gate-to-source limit on SW1, the current through mid-voltage power supply may be approximately 100 mA. In contrast, referring to converter 300 in FIG. 3 with a single super source follower circuit 302, the second current path 304 flowing through the mid-voltage power supply may be reduced to 10-20 mA. Extending the gate driver circuit with the first secondary super source follower circuit 404 in FIG. 4, a third current path 408 will further reduce the current through the mid-voltage power supply to approximately 3-4 mA. The converter 400 may include additional super source follower circuits. In an embodiment, the converter may have a first super source follower circuit operably coupled to the gate lead of a power stage switch (e.g., SW1), a second super source follower circuit operably coupled to the first super source follower circuit, a third super source follower circuit operably coupled to the second super source follower circuit, etc. The requirement of the mid-voltage power supply to handle the gate charge current decreases significantly (e.g., by a factor of approximately a square root) with each additional super source follower circuit. Reducing the gate charge burden on the mid-voltage power supply enables the use of lower cost and less complicated mid-voltage power supply designs.

Figure 5:
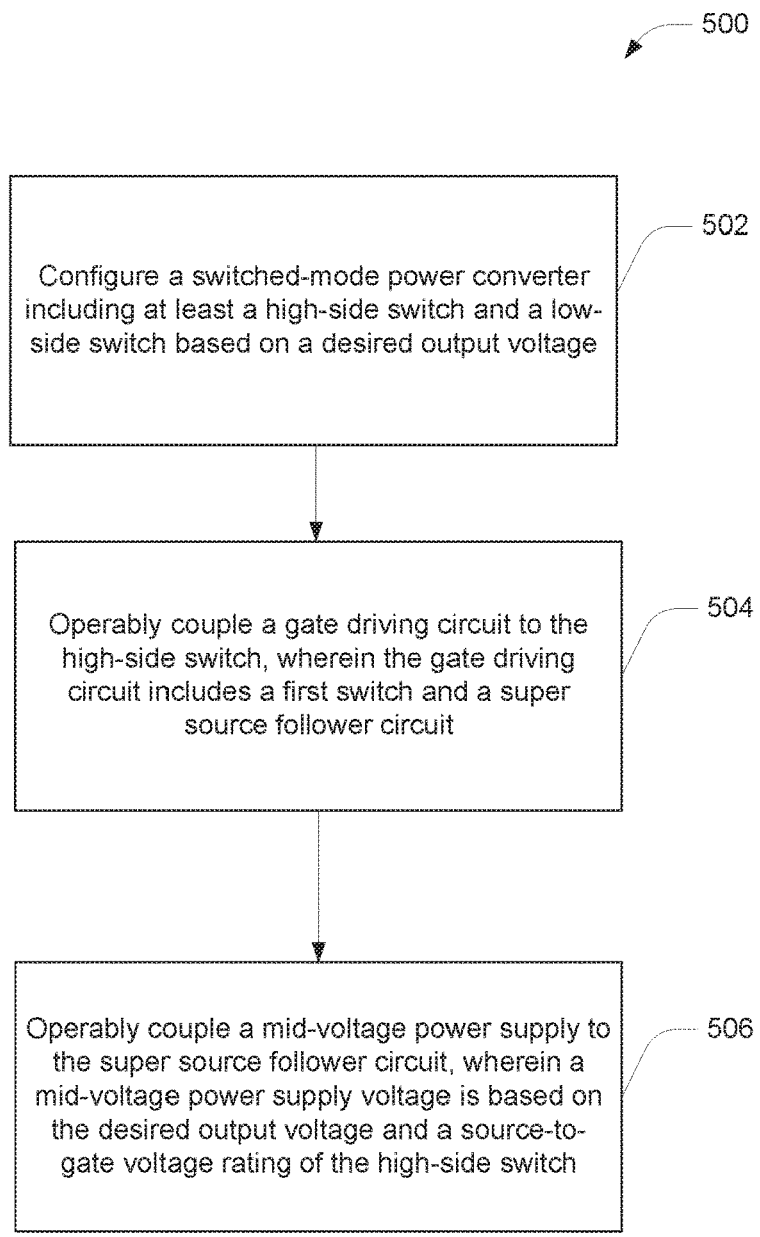
FIG. 5 is an example process flow for constructing elements of a fast transient high-side gate driving circuit.

Referring to FIG. 5, with further reference to FIGS. 3-4, a method 500 for constructing elements of a fast transient high-side gate driving circuit includes the stages shown. The method 500 is, however, an example only and not limiting. The method 500 may be altered, e.g., by having stages added, removed, rearranged, combined, performed concurrently, and/or having single stages split into multiple stages.

At stage 502, the method includes configuring a switched-mode power converter including at least a high-side switch and a low-side switch based on a desired output voltage. The switched-mode power converter may include one or more power switches, inductors and diodes to transfer a DC input to a DC output. These components may be configured to perform power transfer functions such as a step-down function (e.g., a buck converter), a step-up function (e.g., boost converter), or an inverting function (e.g., inverting buck-boost, flyback). Switching converters may be used in other types of power regulation circuits as well. The high-side switch and the low-side switch may be semiconductor devices such as MOSFETS, JFETS and BJTs. In an example, referring to FIG. 3, the high-side switch SW1 may be a p-channel device (e.g., PFET) with a source lead, a gate lead and a drain lead. In some converter circuits, the desired output voltage (Vout) may exceed the gate-to-source voltage rating for the high-side switch SW1. In such a circuit, a gate driving circuit for the high-side switch cannot allow the gate of the high-side switch to directly couple to ground because exceeding the gate-to-source voltage rating may destroy the high-side switch.

At stage 504, the method includes operably coupling a gate driving circuit to the high-side switch, wherein the gate driving circuit includes a first switch and a super source follower circuit. The first switch may be a p-channel device with a source lead, a drain lead and a gate lead. The source of the first switch may be operably coupled to the source of the high-side switch and the drain of the first switch may be operably coupled to the gate of the high-side switch. For example, the first switch may be the PMOS high-side gate switch MP0 in the converter 300. An integrated circuit configured to drive the first switch may be operably coupled to the gate of the first switch. The gate of the high-side switch is also operably coupled to the super source follower circuit. For example, the super source follower circuit may include the PFET MP1, the NFET MN1 and the resistor R1. As depicted in FIG. 3, the gate of the high-side switch SW1 is connected to the source of the PFET MP1 and the drain of the NFET MN1.

At stage 506, the method includes operably coupling a mid-voltage power supply to the super source follower circuit, wherein a mid-voltage power supply voltage is based on the desired output voltage and a gate-to-source voltage rating of the high-side switch. The mid-voltage power supply is configured to reduce the difference between Vout and the voltage on the gate of the high-side switch. For example, if the desired output voltage is 10V and the gate-to-source voltage limit on the high-side switch is 6-8V, then the mid-voltage power supply should be at least 4V. Referring to FIG. 3, the mid-voltage power supply may be operably coupled to the gate of the PFET MP1 and to ground. The mid-voltage power supply is used to clamp the voltage on the gate of the high-side switch between the mid-voltage power supply voltage (e.g., Vmid) and the desired output (e.g., Vout). The Vmid value limits the low side voltage when MN1 is turned on. For example, when the PFET MP1 is turned on, a current flows through the resistor R1. When the voltage across R1 is high enough to turn on the NFET MN1, the voltage gate of SW1 tries to go to ground. As the voltage at the gate of SW1 decreases below the mid-voltage power supply voltage, the gate-to-source voltage across the PFET MP1 drops below the threshold voltage which will turn off the NFET MN1. The advantage of the super source follower is that a higher amount of current created by the high-side switch gate voltage will flow though MN1 to ground. This reduces the amount of current flowing through the mid-voltage power supply and thus reduces the complexity and costs associated with the design and construction of the mid-voltage power supply. For example, in the prior art, a mid-voltage power supply design typically required large internal or external capacitors. The super source follower circuit may eliminate the need for the relatively larger capacitors. Further, the reduction in capacitance may decrease the R-C time constant of the high-side switch and thus enable higher switching frequencies.

The method 500 may be used for power conversion applications when the desired output voltage may exceed the gate-to-source voltage rating of one or more power switches. The method 500 is not limited to high power applications. That is, the method 500 may be implemented in relatively small circuits such as 65 nanometer devices, where the gate-to-source voltage limit is approximately 2V. The present disclosure may be extended to other switches which have a gate-source voltage rating that is less than a drain-source voltage rating. Generally, the super source follower circuit may provide performance improvements in a variety of circuits where a mid-voltage clamp may be used to reduce stress on a semiconductor junction.

Other examples and implementations are within the scope and spirit of the disclosure and appended claims. For example, features implementing functions may be physically located at various positions, including being distributed such that portions of functions are implemented at different physical locations.

Also, as used herein, "or" as used in a list of items prefaced by "at least one of" or prefaced by "one or more of" indicates a disjunctive list such that, for example, a list of "at least one of A, B, or C," or a list of "one or more of A, B, or C," or "A, B, or C, or a combination thereof" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Substantial variations may be made in accordance with specific requirements. For example, customized hardware such as Application Specific Integrated Circuits (ASICs) and System of Chip (SoC) may also be used. The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, some operations may be performed in parallel or concurrently. In addition, the order of the operations may be rearranged. A process may have additional stages or functions not included in the figure. Components, functional or otherwise, shown in the figures and/or discussed herein as being connected or communicating with each other are communicatively coupled. That is, they may be directly or indirectly connected to enable communication between them.

Having described several example configurations, various modifications, alternative constructions, and equivalents may be used without departing from the spirit of the disclosure. For example, the above elements may be components of a larger system, wherein other rules may take precedence over or otherwise modify the application of the present disclosure. Also, a number of operations may be undertaken before, during, or after the above elements are considered. Accordingly, the above description does not bound the scope of the claims.

The invention claimed is:

1. A gate driving circuit for driving a high-side switch in a switching converter, comprising:
   a first switch operably coupled to a source lead and a gate lead of the high-side switch;
   a first super source follower circuit operably coupled to the gate lead of the high-side switch, wherein the first super source follower circuit includes at least a p-channel semiconductor switch, a n-channel semiconductor switch and a resistor; and
   a mid-voltage power supply operably coupled to the first super source follower circuit.

2. The gate driving circuit of claim 1 wherein the high-side switch is a p-channel semiconductor switch.

3. The gate driving circuit of claim 2 wherein the high-side switch is a p-type field-effect transistor (PFET).

4. The gate driving circuit of claim 1 wherein the p-channel semiconductor switch is a p-type field-effect transistor (PFET) and the n-channel semiconductor switch is a n-type field-effect transistor (NFET).

5. The gate driving circuit of claim 4 wherein a source of the PFET is operably coupled to the gate lead of the high-side switch, and a drain lead of the PFET is operably coupled to a gate lead of the NFET and the resistor.

6. The gate driving circuit of claim 5 wherein the mid-voltage power supply is operably coupled to a gate of the PFET.

7. The gate driving circuit of claim 1 wherein the switching converter is configured to output a desired output voltage and a voltage output of the mid-voltage power supply is greater than a difference between the desired output voltage and a gate-to-source voltage rating for the high-side switch.

8. The gate driving circuit of claim 1 further comprising at least a second super source follower circuit operably coupled between the first super source follower circuit and the mid-voltage power supply.

9. The gate driving circuit of claim 8 further comprising at least a third super source follower circuit operably coupled between the second super source follower circuit and the mid-voltage power supply.

10. A method of constructing a switched-mode power converter, comprising:
    configuring the switched-mode power converter including at least a high-side switch and a low-side switch based on a desired output voltage;
    operably coupling a gate driving circuit to the high-side switch, wherein the gate driving circuit includes a first switch and a first super source follower circuit;
    operably coupling a mid-voltage power supply to the first super source follower circuit, wherein a mid-voltage power supply voltage is based on the desired output voltage and a gate-to-source voltage rating of the high-side switch; and
    operably coupling a second super source follower circuit between the first super source follower circuit and the mid-voltage power supply.

11. The method of claim 10 wherein the desired output voltage is greater than the gate-to-source voltage rating for the high-side switch.

12. The method of claim 10 wherein the first super source follower circuit includes at least a p-type field-effect transistor (PFET), a n-type field-effect transistor (NFET), and a resistor, and operably coupling the gate driving circuit to the high-side switch includes connecting a source lead of the PFET and a drain lead of the NFET to a gate lead on the high-side switch.

13. The method of claim 12 wherein operably coupling the mid-voltage power supply to the first super source follower circuit includes operably coupling the mid-voltage power supply to a gate lead on the PFET.

14. The method of claim 10 wherein the mid-voltage power supply voltage is greater than a difference between the desired output voltage and the gate-to-source voltage rating of the high-side switch.

15. A gate driving circuit, comprising:
   a power stage switch including a gate-source voltage rating and a drain-source voltage rating, wherein the gate-source voltage rating is lower than the drain-source voltage rating;
   a first super source follower circuit operably coupled to a gate lead of the power stage switch, wherein the first super source follower circuit includes at least a p-channel semiconductor switch, a n-channel semiconductor switch and a resistor; and
   a mid-voltage power supply operably coupled to the first super source follower circuit.

16. The gate driving circuit of claim 15 wherein the power stage switch is an n-channel semiconductor switch.

17. The gate driving circuit of claim 15 wherein the power stage switch is a p-type field-effect transistor (PFET).

18. The gate driving circuit of claim 15 wherein the p-channel semiconductor switch is a p-type field-effect transistor (PFET) and the n-channel semiconductor switch is a n-type field-effect transistor (NFET).

19. The gate driving circuit of claim 18 wherein the mid-voltage power supply is operably coupled to a gate of the PFET.

20. The gate driving circuit of claim 15 further comprising at least a second super source follower circuit operably coupled between the first super source follower circuit and the mid-voltage power supply.

21. The gate driving circuit of claim 20 further comprising at least a third super source follower circuit operably coupled between the second super source follower circuit and the mid-voltage power supply.

22. An apparatus, comprising:
   a power converter means including a power stage switch;
   a gate driving means operably coupled to the power stage switch, wherein the gate driving means includes a first super source follower circuit; and
   a mid-voltage power means operably coupled to the first super source follower circuit, and
   a second super source follower circuit operably coupled between the first super source follower circuit and the mid-voltage power means.

23. The apparatus of claim 22 wherein the power stage switch includes a gate-source voltage rating and a drain-source voltage rating, and the gate-source voltage rating is less than the drain-source voltage rating.

24. The apparatus of claim 23 wherein an output voltage from the power converter means is greater than the gate-source voltage rating.

25. The apparatus of claim 24 wherein the mid-voltage power means provides a mid-voltage value that is greater than a difference between the output voltage and the gate-source voltage rating.

26. The apparatus of claim 22 wherein the first super source follower circuit includes at least a p-type field-effect transistor (PFET), a n-type field-effect transistor (NFET), and a resistor.

* * * * *